(12) United States Patent
Wiese

(10) Patent No.: US 6,665,697 B1
(45) Date of Patent: Dec. 16, 2003

(54) FOURIER ANALYSIS METHOD AND APPARATUS CALCULATING THE FOURIER FACTOR $W_N$ UTILIZING TRIGONOMETRIC RELATIONS

(75) Inventor: Stefan Wiese, Köln (DE)

(73) Assignee: Forschungszentrum Julich GmbH, Julich (DE)

(*) Notice: Subject to any disclaimer, the term of this patent is extended or adjusted under 35 U.S.C. 154(b) by 432 days.

(21) Appl. No.: 09/605,061

(22) Filed: Jun. 28, 2000

(30) Foreign Application Priority Data

Jul. 2, 1999 (DE) .......................... 199 30 707

(51) Int. Cl.[7] .............................................. G06F 17/14
(52) U.S. Cl. ........................................................ 708/404
(58) Field of Search ................. 708/404, 405, 708/403

(56) References Cited

U.S. PATENT DOCUMENTS 6,230,176 B1 * 5/2001 Mizutani ................... 708/404

2002/0178194 A1 * 11/2002 Aizenberg et al. .......... 708/404

OTHER PUBLICATIONS

Numerical Recipes in C—The Art of Scientific Computing—Second Edition; William H.Press et al; Chapter 12. "Fast Fourier Transform, p. 496–536; Chapter 13." Fourier and Spectral Applications, pp. 537–608.

* cited by examiner

Primary Examiner—David H. Malzahn
(74) Attorney, Agent, or Firm—Herbert Dubno

(57) ABSTRACT

The data carrying signals to be synthesized into an image, to be subject to data compression can be subjected to Fourier transformation by the formation of a Fourier factor $W_N$ which is a function of a trigonometric factor $\Delta C_1$ utilizing a factor II defined by the relationship:

$$\Delta c_1 = \cos x - 1 = -2 \sin^2 (x/2)$$

where $x = 2\pi/N$ and N=number of data points.

6 Claims, 3 Drawing Sheets

FOURIER ANALYSIS METHOD AND APPARATUS CALCULATING THE FOURIER FACTOR $W_N$ UTILIZING TRIGONOMETRIC RELATIONS

FIELD OF THE INVENTION

My present invention relates to an analysis method and apparatus and, more particularly, to a system utilizing Fourier transformation methods for analyzing data and deriving useful information from spectrally analyzed signals, i.e. signals obtained from physical processes and in which there is a frequency variation and amplitudes associated with frequency of such signals.

BACKGROUND OF THE INVENTION

In a number of imaging processes, it is common to subject an object to electromagnetic radiation over a broad spectral range and to analyze reflected or transmitted or scattered or back scattered radiation as a function of time to determine, for example, amplitude as a function of frequency or other parameters of the radiation.

By such methods, which frequently can utilize Fourier analysis of the signals of mixed or varying frequency, it is possible to measure a change in signal intensity as a function of time or a relationship between intensity and frequency which represents data providing information as to the analyzed object. The object can be a part of the human body, some other animate object, an inanimate object or a less tangible object such as speech, music or the like.

The analysis can involve decomposing a mixed frequency signal into different oscillation segments, for example, elemental frequencies, and determining the relative intensities of these segments at a point in time and/or variation of the amplitudes of the different frequencies as a function of time. Typically the analysis utilizes Fourier transformation (FT) and yields an indication of the components or shape or variation in density or presence or absence of cell masses or other patterns of the object.

Fourier transforms are thus used in a variety of image generating and spectroscopic analyses and methods.

In nuclear magnetic resonance spectroscopy, for example, the object can be irradiated with radiant energy pulses in the ultrashort wavelength range whereby protons or other atomic particles or nuclei absorb the applied energy and, depending upon their Larmor frequencies reemit energy. By measuring the time course of a summation signal from the radiation scanning or analysis of the object and utilizing Fourier transformation, for example, in nuclear magnetic resonance spectrometry, frequency spectra can be produced from the time spectra. It is thus possible to determine how many nuclei, for example, absorb or emit and at which frequencies and over the course of time.

An image can thus be generated of tissue densities in the human body and, if the calculation and analysis is done on a real time such images can be displayed and can be interpreted by skilled technicians to signal pathologies or the like.

There are other measurement processes utilizing the same or similar principles in, for example, computer tomography in which the applied radiation is x-ray radiation, magnetic resonance technology also utilizing ultrashort waves, music and spectral analyses of voice or other acoustic signals, as well as various process which utilize data compression (JPEG or MPEG).

The digitized results obtained are processed by, for example, DISCRETE FOURIER TRANSFORMATION (DFT) which yields results which can be treated in terms of the following formula.

$$A_n := \sum_{k=0}^{N-1} W_N^{nk} a_k \qquad \text{FORMULA 1}$$

In Formula 1:
A=spectrum,
$A_n$=point in spectrum,
$W_N$=Fourier Factor
N=Number of the Measuring point
a=Measuring Signal
$a_k$=point in the measurement signal
n=run number=0, 1, 2, . . . N−1
k=summation index=0,1,2, . . . N−1

The Fourier factor $W_N$ in turn is equal to the value given in Formula 2

$$W_N = \exp(\pm i\, 2\pi/N) \qquad \text{Formula 2}$$

or in Formula 3

$$W_N^{nk} = \exp(\pm i 2\pi nk/N) \qquad \text{Formula 3}$$

In order to process the information especially quickly, the computer or analysis circuitry can be designed so that the right side of Formula 1 is decomposed into sums with even and odd indices k. $A_N$ can thus be given as shown in Formula 4, $$A_n = \underbrace{\sum_{k=0}^{N-1} W_{N/2}^{n'k} a_{2k}}_{=:\, A_{n'}^{(0)}} + W_N^{n'} \underbrace{\sum_{k=0}^{N/2-1} W_{N/2}^{n'k} a_{2k+1}}_{=:\, A_{n'}^{(1)}} \qquad \text{FORMULA 4}$$

as the sum of two N/2-point Fourier transformations $A_{n'}^{(0)}$ and $A_{n'}^{(1)}$.

In this relationship:
n'=the number in the sequence of data points=0,1,2. . . ,N/2−1
(0)=the even indices n
(1)=the odd indices n.

With this set of rules, measured information can be evaluated especially rapidly.

A discrete Fourier transformation with N complex value data points (N-Point-DFT) can be reduced by the following mixing rules to two N/2-point DFT:

$$A_{n'} = A_{n'}^{(0)} + W_N^{n'} A_{n'}^{(1)} \qquad \text{Formula 5}$$

$$A_{n'+N/2} = A_{n'}^{(0)} - W_N^{n'} A_{n'}^{(1)} \qquad \text{Formula 6}$$

With $$n' = 0, 1 \ldots, N/2-1 \qquad \text{For Formulas 4, 5 and 6}$$

If N is the second power, the calculation can be carried out in a fully recursive manner: $A_n$ results by the mixing of $A_{n'}^{(0)}$ and $A_{n'}^{(0)}$, $A_{n'}^{(0)}$ can be obtained by a mixing of $A_{n'}^{(00)} := (A_{n^*}^{(0)})^{(0)}$ and $A_{n^*}^{(01)} := (A_{n^*}^{(0)})$, $A_{n'}^{(1)}$ by a mixing of $A_{n^*}^{(10)} := (A_{n^*}^{(1)})^{(0)}$ and $A_{n^*}^{(11)} := (A_n^{n(1)})^{(1)}$ etc.

As the starting point for the recursion, the DFT according to Formulas 1 and 2 has individual values equal to this value itself. This means that for each sample of m: $=\text{Log}_2$ (N) ones and zeroes, there is a 1-point DFT which corresponds to the input value $$\exists k \in <-0,1, \ldots, N-1>: A_o^{(b1b2\ldots bm)} = a_k \quad \text{Formula 7}$$

$$b_i \in <0,1>; i=1,2, \ldots m \quad \text{Formula 8}$$

For the successive separation of the sum into even and odd indices, for the determination of k the bit sample $(b_1, b_2, \ldots b_m)$ is only read from right to left:

$$A_0^{(k)} = a_{bit-reversed(k)} \quad \text{Formula 9}$$

With:

$$k=0,1, \ldots, N-1$$

which has been found to be cost effective in practice because of the shorter processing time.

OBJECTS OF THE INVENTION

It is, therefore, the principal object of the invention to provide a measurement process or method and a measurement apparatus or chip which significantly reduces the relative error and permits the Fourier transformation to be carried out more rapidly in earlier systems.

It is also an object of the invention to provide improved electronic circuitry for facilitating the improved measurement process or for incorporation in the improved measurement apparatus.

Still another object of the invention is to provide a system for a Fourier transformation of data, especially in image formation, whereby drawbacks of earlier systems are avoided.

SUMMARY OF THE INVENTION

These objects are achieved, in accordance with the invention in an automatic method which comprises the steps of:
(a) acquiring data-carrying signals representing a condition to be analyzed;
(b) subjecting the data-carrying signals to at least one conversion from one domain to at least one other domain by a Fourier transformation involving determination of a Fourier factor $W_N$; and
(c) calculating the Fourier factor $W_N$ using a Factor II defined by the relationship:

$$\Delta c_1 = \cos x - 1 = -2 \sin^2 (x/2)$$

where $x=2\pi/N$ and N=number of data points.

Preferably the Factor II is transformed in the relationships V and VII as follows:

$$\Delta c_{n+1} = 2 \Delta c_1 \cdot c_n + \Delta c_n \quad \text{Relationship V,}$$

$$\Delta s_{n+1} = 2 \Delta c_1 \cdot s_n + \Delta s_n \quad \text{Relationship VII.}$$

The electronic circuitry in which the method of the invention is embedded can be a chip as will be discussed in greater detail below.

The term measurement process and the term measurement method is used here in the sense of a method which can extract frequency information from time signals or local information with local frequency signals or which derive time signals or local information from frequency information.

In particular, these terms are intended to refer to a frequency analysis process. The analyzed frequencies can be time frequencies or local frequencies related to object scanning or events generated by an object. Included in these categories are image producing processes like computer tomography from which measurement points are acquired and combined to from an image. In addition to CAT scans, nuclear magnetic resonance (NMR) involving nuclear magnetic resonance spectroscopy or image forming methods are covered. The measurement processes to which the invention are applicable include acoustic measurement processes and has been noted these can involve noise or sound analysis and the processes can be diagnostic processes on human patients or animals. Of course image forming techniques which involve inanimate objects are also intended to be covered.

When a measurement apparatus within the invention is considered, it is intended to include all apparatus which can acquire a time dependent signal capable of being interpreted by Fourier transformation. Examples include: nuclear magnetic resonance spectrometers and tomographs. Microphones for analyzing voice, noise and music signals, computer tomographs, speech regulation systems and systems for detecting, imaging or analyzing inanimate objects including recognition systems and safety or protective systems, for example, for detecting dangerous contents of a suitcase or the like at an airport.

A DFT based upon formulas 5, 6 and 9 is usually referred to as a fast Fourier transformation (FFT) since the number of calculating steps is reduced from that required for direct collection according to Formula 1 from $N^2$ to $N\log_2(N)$.

Reference is made to the identity $\exp(ix)=\cos(x)+\sin(x)$ which requires sine and cosine values for the above described procedure (calculation of the Fourier Factor $W_N$) for arguments of the form nx where $n=0,1, \ldots N-1$ and $x: 2\pi/N$.

The addition theorem for trigonometric functions:

$$\cos [(n+1)x] = \cos (nx) \cos x - \sin (nx) \sin x \quad \text{Formula 10}$$

$$\sin [(n+1)x] = \sin (nx) \cos x + \cos (nx) \sin x \quad \text{Formula 11}$$

with the formulas 10 and 11, one can operate with the fastest implementation of FFT as well be apparent from W. H. Press; Numerical Recipes in C; Cambridge University Press; ISBN 0 521 43108 5.

The measurement method, imaging process and chip programmed in accordance with the invention have, however, a not in considerable error ratio. Because of rounding errors at certain decimal positions, relative errors of several percent can arise which is undesirable. Because of the shorter operation time of the present invention, these do not pose major problems.

BRIEF DESCRIPTION OF THE DRAWING

The above and other objects, features, and advantages will become more readily apparent from the following description, reference being made to the accompanying drawing in which.

SPECIFIC DESCRIPTION

Figure 2:
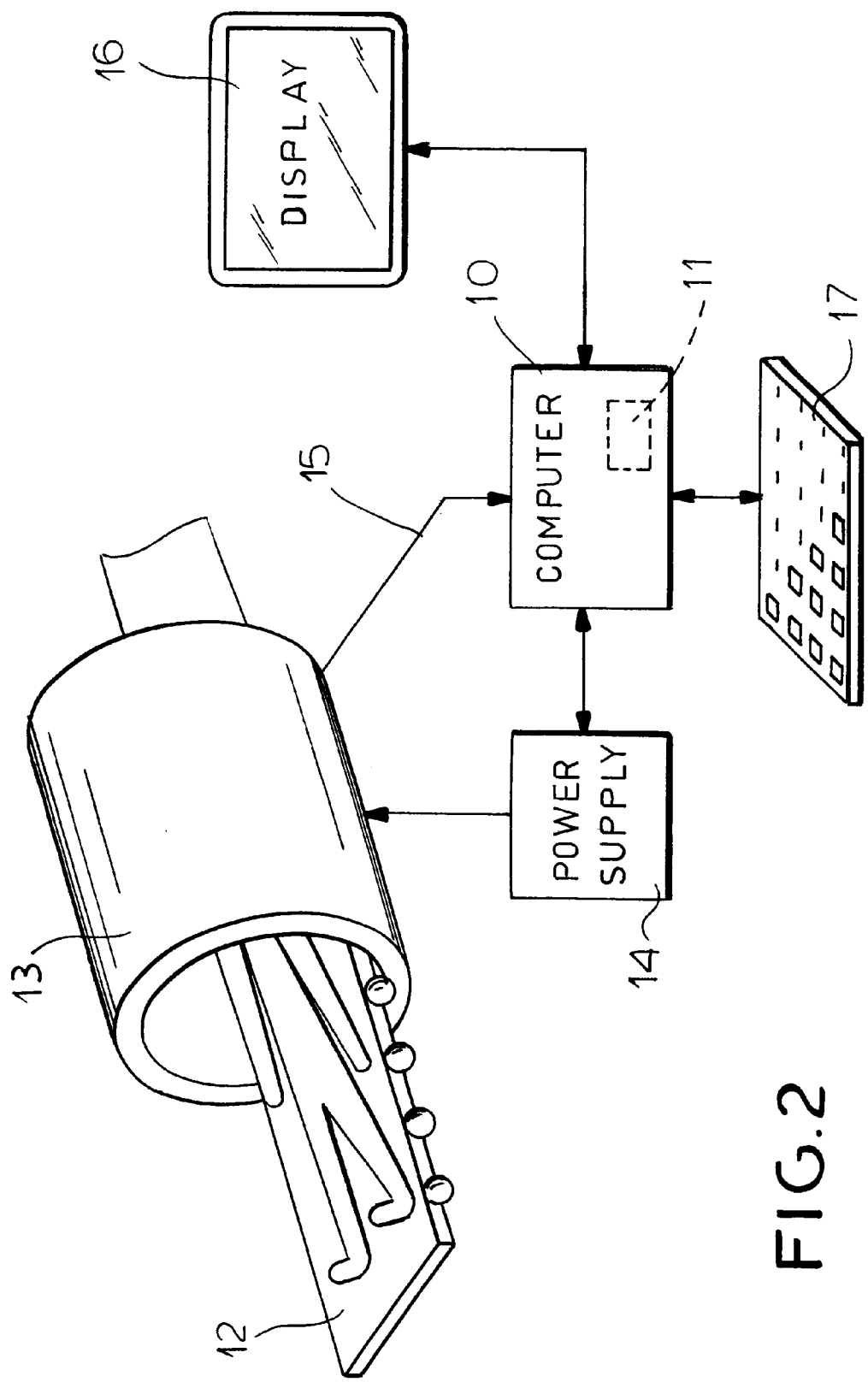
FIG. 2 is a diagram of the apparatus for carrying out the invention utilizing NMR imaging.
Figure 3:
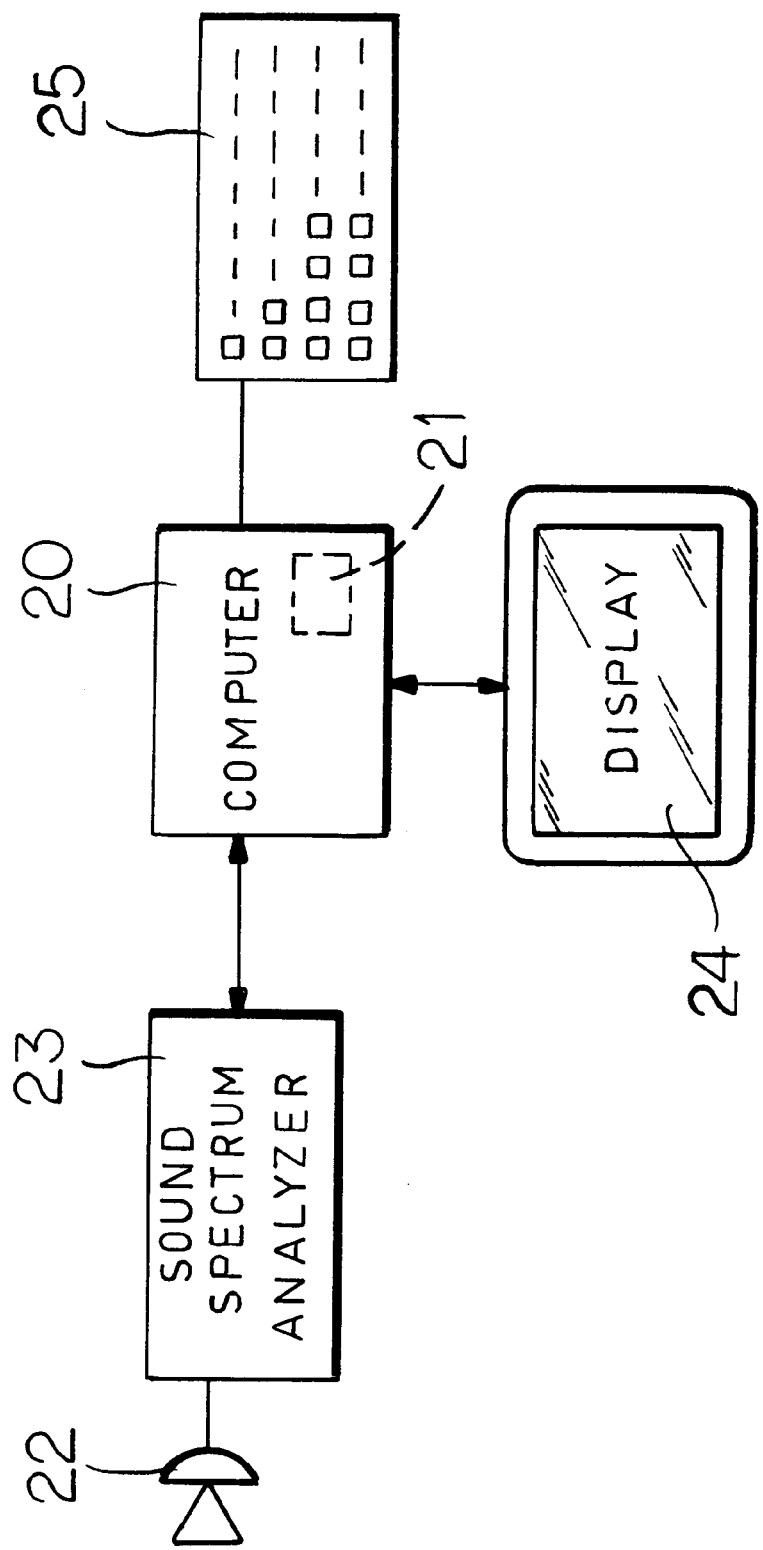
FIG. 3 is a diagram of an apparatus for voice and other sound analysis.

Referring first to FIGS. 2 and 3, it will be apparent that the invention can utilize a computer 10 or 20 having a processor chip represented diagrammatically at 11, 21 in which the program of the invention can be embedded. The apparatus of FIG. 2 comprises the usual patient support 12 and ultrashortwave scanner 13 excited by a power supply 14 controlled by the computer 10 which receives the signals to be subjected to analysis via line 15 and can display the NMR image 16. The computer is controlled, for example, by the keyboard 17. Analogously the sound analyzer of FIG. 3 can include a microphone pickup 22 which is connected to the sound spectrometer 23 controlled by the computer 20 and display the analyzed result at 24. The computer is controlled by the keyboard 25.

Figure 1:
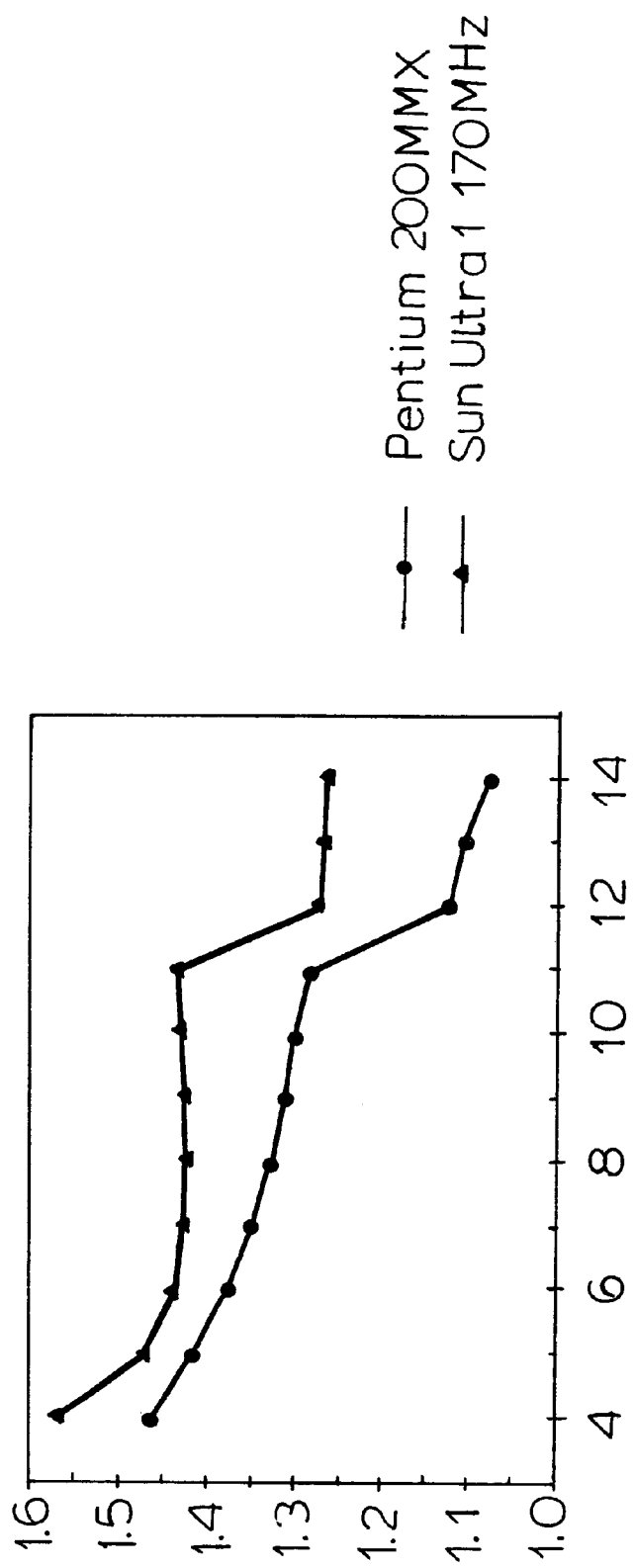
FIG. 1 is a graph showing the ratio of the calculating time requirements with conventional methods and the method of the invention as a function of the number of data points.

Turning to FIG. 1, the abscissa x displays the base-two logarithm ($\log_2$) of the count of the complex value points while the ordinate y shows the processing time of the reference system 1× according to the invention. Table 1 attached hereto shows the implementation of the FFT analysis of the invention in C programming language.

According to the invention, the terms $\cos[(n+1)x]$ and $\sin[(n+1)x]$ are so formed that, with respect to the formulas 10 and 11, two multiplications are saved. This can be achieved when one considers the difference between the sine and cosine values as follows:

$$\Delta c_{n+1} = \cos[(n+1)x] - \cos(nx) \quad \text{Formula 12}$$
$$= -4\sin^2(x/2)\cos(nx) + \{\cos(nx) - \cos[(n-1)x]\}$$
$$= -4\sin^2(x/2)\cos(nx) + \Delta c_n$$

$$\Delta S_{n+1} = \sin[(n+1)x] - \sin(nx) \quad \text{Formula 13}$$
$$= -4\sin^2(x/2)\sin(nx) + \{\sin(nx) - \sin[(n-1)x]\}$$
$$= -4\sin^2(x/2)\sin(nx) + \Delta S_n$$

The relations can be simplified to the following:

$$\cos[(n+1)x] = \cos(nx) + \Delta c_{n+1} \quad \text{Formula 14}$$
$$\sin[(n+1)x] = \sin(nx) + \Delta S_{n+1} \quad \text{Formula 15}$$

Substituting in these formulas $$C_n = \cos(nx) \quad \text{Formula 16}$$

and $$S_n = \sin(nx) \quad \text{Formula 17}$$

One obtains the following:

$$C_0 = 1 \text{ and } S_0 = 0. \quad \text{I}$$
$$\Delta C_1 = \cos x - 1 = -2\sin^2(x/2) \quad \text{II}$$
$$\Delta s_1 = \sin x = (-\Delta c_1(2+\Delta c_1))^{1/2}, \quad \text{III}$$

where $x \in [-\pi; \pi]$.

$$Cn = C_{n-1} + \Delta C_n. \quad \text{IV}$$
$$\Delta C_{n+1} = 2\Delta C_1 \cdot C_n + \Delta c_n \quad \text{V}$$
$$Sn = S_{n-1} + \Delta S_n. \quad \text{VI}$$
$$\Delta S_{n+1} = 2\Delta C_1 \cdot S_n + \Delta S_n. \quad \text{VII}$$

According to the invention, utilizing the Factor II, the Fourier factor $W_N$ can be obtained which is necessary for the transformation of a signal in one domain to at least one other domain.

Repetition of the Steps IV through VII supplies all of the sine and cosine values required for the FFT. For each individual critical value, a multiplication is saved.

Furthermore, the values obtained by the process steps I–VII for the sine/cosine are more precise than values obtained in accordance with state of the art methods since fewer soundings are required. Depending upon the floating point processor used, the precision can be improved between 10 and 20%. This will be apparent from FIG. 1.

By way of example, in Table 1 attached hereto, the implementation of the FFT analysis in the program language C is given. In the presentation in Table 1 the real and imaginary parts are interchangeable in the data □.

The implementation can easily be expanded such that two neighboring complex value data points can have a given spacing delta from one another in memory which allows multidimensional FFT's to be realized very effectively. The delta is inserted into the programming operations and replaces each i or j which is found in square brackets simply by i*delta or j*delta. The calculating time for implementation of the FFT according to the invention is comparable to that obtained by the Quasi-Standard-Implementierung of W. H. Press; Numerical Recipes in C; Cambridge University Press; ISBN 0 521 43108 5. Tests were carried out on a Sun-Ultra-1-Workstation (GNU C-Complier 2.7) and on a conventional Pentium-200-MMX-PC (Borland C/C++5.01) at the respective highest optimization stage. The mean computing time was measured for a transformation of $2^k$ with k=4,5 . . . 14 complex-valued data points. The results are shown in FIG. 1. The graph of FIG. 1 illustrates the comparison between FFT implementation according to the invention with the Quasi-Standard-Implementierung of W. H. Press; Numerical Recipes in C; Cambridge University Press; ISBN 0 521 43108 5. The ratio is given of the mean computing times according to the state of the art and the invention. Along the abscissa X is plotted: $\log_2$ (number of complex valued points) Ordinate Y; time (reference)/time (invention).

The reference variant required about 40% more computing time. With increasing numbers of data points the running time differences between the two processes dimensions because the sine and cosine values and the setting of the start state for the recursion becomes reduced in weight by comparison to mixing.

The implementation of the FFT is significantly more stable and rapid than that of the state of the art. That means that the quality of the calculated results with multiple use of the Fourier transformation on a data set continues for a longer period of time. This is the result of the reduced rounding errors.

The measurement process of the invention can be embodied in a number of systems and apparatuses as follows.

Computer Tomography

In computer tomography, utilizing an apparatus of the type shown in FIG. 2 wherein the exciter 13 is replaced by a scanning x-ray apparatus rotated about the patient and under control of the computer, the patient is irradiated with x-rays and the absorption signal is measured utilizing a filtered back proportion and FFT applied thereto, layer by layer images of the scanned parts of the body are generated and displayed. There need be no transformation of time signals to frequency signals in this case although a transformation of local frequencies to particular localities can be obtained. A similar use of the process can be for scanning suitcases at airports.

Magnetic Resonance Tomography

The apparatus of FIG. 2 is used and an object, such as a patient, is subjected to a magnetic field gradient so that at different locations of the scanned subject different magnetic field strengths as applied from the exterior, exist. The object is irradiated with broad band radiofrequency pulses. Certain frequency components are absorbed and the absorbed radiation can be emitted and detected as summation signals. The frequency analysis transforms the time signals into a frequency domain. Based upon the local differences in the magnetic field, the regions in the object are correlated with the frequency and the locality to produce the image.

Acoustic Analysis

Speech recognition utilizes the apparatus of FIG. 3 with the microphone 22 measuring the oscillations in the air which are produced by speech. The air pressure is converted into electrical signals which contain all acoustic frequencies which are picked up in the times domain. The electrical signals are decomposed by means of the process of the invention into their frequency components each sound is a compilation of certain frequency samples that based upon the frequency samples the sound can be defined and the conversion from the time domain into the frequency domain effected.

Data compression in all of the systems describing the image data can form gray values from which local frequency samples can be analyzed.

These can be extracted by the method of the invention. The white tones can be correspond to peaks and the dark tones to troughs in the wave samples. Analysis of this type allows the generation of a local frequency image and surplus local frequencies can be sorted out. In an analogous way, the process can also be used for color images in which all three color components such as red, green and blue can be separately treated.

I claim:

1. A method of analysis comprising the steps of:
   (a) acquiring data-carrying signals representing a condition to be analyzed;
   (b) subjecting said data-carrying signals to at least one conversion from one domain to at least one other domain by a Fourier transformation involving determination of a Fourier factor $W_N$ which is a function of a trigonometric factor $\Delta C_1$; and
   (c) calculating said Fourier factor $W_N$ using a Factor II defined by the relationship:

$$\Delta cC_1 = \cos x - 1 = -2 \sin^2 (x/2)$$

where $x = 2\pi/N$ and $N$ = number of data points.

2. The method defined in claim 1 wherein in the calculation of the Fourier factor in step (c) wherein $W_{m\underline{N}}$ is a function of trigonometric factors $\Delta C_{n+1}$ and $\Delta s_{n+1}$ and the Factor II is introduced into the relationships:

$$\Delta c\underline{C}_{n+1} = 2 \Delta c\underline{C}_1 \cdot c\underline{C}_n + \Delta c\underline{C}_n \quad \text{Relationship V,}$$

$$\Delta s_{n+1} = 2 \Delta c\underline{C}_1 \cdot s_n + \Delta s_n \quad \text{Relationship VII.}$$

3. An apparatus for analysis comprising:
   means for acquiring data-carrying signals representing a condition to be analyzed;
   electronic evaluating means connected to said means for acquiring said data-carrying signals for subjecting said data-carrying signals to at least one conversion from one domain to at least one other domain by a Fourier transformation involving determination of a Fourier factor $W_N$
   which is a function of a trigonometric factor $\Delta C_1$; and
   means for calculating said Fourier factor $W_N$ using a Factor II defined by the relationship:

$$\Delta c\underline{C}_1 = \cos x - 1 = -2 \sin^2 (x/2)$$

where $x = 2\pi/N$ and $N$ = number of data points.

4. The apparatus defined in claim 3 wherein in the calculation of the Fourier factor $W_{n\underline{N}}$ (c) wherein $W_{n\underline{N}}$ is a function of trigonometric factors $\Delta \overline{C}_{n+1}$ and $\Delta s_{n+1}$ and the factor II is introduced into the relationships:

$$\Delta c\underline{C}_{n+1} = 2 \Delta c\underline{C}_1 \cdot c\underline{C}_n + \Delta c\underline{C}_n \quad \text{Relationship V,}$$

$$\Delta s_{n+1} = 2 \Delta c\underline{C}_1 \cdot s_n + \Delta s_m \quad \text{Relationship VII.}$$

5. A chip programmed for subjecting data-carrying signals to at least one conversion from one domain to at least one other domain by a Fourier transformation involving determination of a Fourier factor $W_N$ which is a function of a trigonometric factor $\Delta C_1$ using a Factor II defined by the relationship:

$$\Delta c\underline{C}_1 = \cos x - 1 = -2 \sin^2 (x/2)$$

where $x = 2\pi/N$ and $N$ = number of data points.

6. The chip defined in claim 5 wherein in the calculation of the Fourier factor $W_{n\underline{N}}$ (c) wherein $W_{n\underline{N}}$ is a function of trigonometric factors $\Delta \overline{C}_{n+1}$ and $\Delta s_{n+1}$ and the Factor II is introduced into the relationships:

$$\Delta c\underline{C}_{n+1} = 2 \Delta c\underline{C}_1 \cdot c\underline{C}_n \quad \text{Relationship V,}$$

$$\Delta s_{n+1} = 2 \Delta c\underline{C}_1 \cdot s_n + \Delta s_n \quad \text{Relationship VII.}$$

* * * * *